United States Patent
Lim et al.

(10) Patent No.: US 11,387,780 B1
(45) Date of Patent: Jul. 12, 2022

(54) OSCILLATOR DEVICE

(71) Applicant: SAMSUNG ELECTRO-MECHANICS CO., LTD., Suwon-si (KR)

(72) Inventors: Tae Ho Lim, Suwon-si (KR); Joo Yul Ko, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

(21) Appl. No.: 17/488,488

(22) Filed: Sep. 29, 2021

(30) Foreign Application Priority Data

Jul. 22, 2021 (KR) .................. 10-2021-0096320

(51) Int. Cl.
*H03B 5/12* (2006.01)
*H03B 5/24* (2006.01)
*H03K 17/96* (2006.01)

(52) U.S. Cl.
CPC ............ *H03B 5/1212* (2013.01); *H03B 5/24* (2013.01); *H03K 17/9622* (2013.01)

(58) Field of Classification Search
CPC .... H03B 5/1212; H03B 5/24; H03K 17/9622; G06F 3/0414
USPC .... 331/158, 57, 167, 74; 345/173, 174, 204; 438/381
See application file for complete search history.

(56) References Cited

U.S. PATENT DOCUMENTS

| | | | | |
|---|---|---|---|---|
| 7,123,112 B2* | 10/2006 | Kang | ............. | H03B 5/1228 331/177 V |
| 7,123,113 B1* | 10/2006 | Brennan | ............. | H03L 5/00 331/74 |
| 7,420,429 B2* | 9/2008 | Cha | ............. | H03B 5/1212 331/46 |
| 8,368,479 B2* | 2/2013 | Grewing | ............. | H03L 7/0995 331/34 |
| 2016/0253020 A1* | 9/2016 | Frey | ............. | G06F 1/1694 345/174 |
| 2018/0131542 A1 | 5/2018 | Nikunen et al. | | |
| 2021/0034186 A1 | 2/2021 | Ryu et al. | | |

FOREIGN PATENT DOCUMENTS

KR 10-2018-0037145 A 4/2018
KR 10-2021-0015587 A 2/2021

\* cited by examiner

*Primary Examiner* — Arnold M Kinkead
(74) *Attorney, Agent, or Firm* — NSIP Law (57) ABSTRACT

An oscillator device includes a touchpad, and an oscillator that includes an oscillation core having a second terminal configured to output an oscillation signal generated by the oscillation core based on an input to a first terminal of the oscillation core, a first capacitor connected between the first terminal and a ground, and a second capacitor connected between the second terminal and the ground, where the first capacitor is connected to the touchpad, and where a total capacitance of the first capacitor is different from a total capacitance of the second capacitor.

20 Claims, 5 Drawing Sheets

$$f = \frac{1}{2\pi\sqrt{L*C}}$$
$$C = \frac{C1*C2}{C1+C2} = C1 \ [C1 << C2]$$
$$\text{SENSITIVITY} = \sqrt{\frac{Cs}{C1}}$$

OSCILLATOR DEVICE

CROSS-REFERENCE TO RELATED APPLICATION(S)

This application claims the benefit under 35 USC 119(a) of Korean Patent Application No. 10-2021-0096320 filed on Jul. 22, 2021 in the Korean Intellectual Property Office, the entire disclosure of which is incorporated herein by reference for all purposes.

BACKGROUND

1. Field

The present disclosure relates to oscillator devices.

2. Description of Related Art

In general, a keyless system may be an interface device that may be used as/in a user interface device of an electronic device, e.g., instead of or in addition to the user interface having an externally exposed mechanical button.

A capacitive sensor using a capacitive method as a touch sensor for sensing an action of pressing a button may be employed in such a keyless system, as a non-limiting example. For example, when there is a touch of a human finger, the capacitive sensor may sense the touch using a frequency change characteristic of an oscillator.

Typically, the total number of oscillators is required to be equal to the total number of touch sensors of a corresponding user interface, and thus, overall consumption current may be determined by the number of oscillators. When an output frequency of the oscillator of such a touch sensor is high, having a high current consumption, a corresponding sensitivity may be greater than a touch sensor with a lower oscillator output frequency having a lower current consumption.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an oscillator device includes an oscillation core having a second terminal configured to output an oscillation signal generated by the oscillation core based on an input to a first terminal of the oscillation core, a first capacitor connected between the first terminal and a ground, and a second capacitor connected between the second terminal and the ground, where a total capacitance of the first capacitor is different from a total capacitance of the second capacitor.

The first capacitor may be connected to a capacitive touchpad through an input terminal of the oscillator device connected to the first terminal, the input to the first terminal of the oscillation core may be dependent on whether a body having a capacitance is touching the touchpad, and the total capacitance of the first capacitor may be lower than the total capacitance of the second capacitor.

The total capacitance of the first capacitor may satisfy C1=m×C2, where C1 denotes the total capacitance of the first capacitor, C2 denotes the total capacitance of the second capacitor, and m denotes a ratio variable between the total capacitance of the first capacitor and the total capacitance of the second capacitor, where the ratio variable may be a real number of 3 or more.

The device may further include an output circuit connected between the second terminal and an output terminal of the oscillator device, where the output circuit may be configured to control a selective output of the oscillation signal at the output terminal.

The device may further include an output circuit connected between the second terminal and an output terminal of the oscillator device, where the output circuit may be configured to enable or disable an output of the oscillation signal at the output terminal based on an enable signal.

The device may further include an output circuit may include a logic circuit configured to control the output of the oscillation signal at the output terminal based on the enable signal.

The oscillation core may include an inductor and a gain adjuster connected in parallel in a differential oscillating structure.

The oscillation core may include, in a differential oscillating structure, an inductor, a pair of cross-coupled transistors, and a gain adjuster.

In one general aspect, an oscillator device includes a touchpad, and an oscillator including a second terminal configured to output an oscillation signal generated by the oscillation core based on an input to a first terminal of the oscillation core, a first capacitor connected between the first terminal and a ground, and a second capacitor connected between the second terminal and the ground, where the first capacitor is connected to the touchpad, and a total capacitance of the first capacitor is different from a total capacitance of the second capacitor.

The first capacitor may be connected to the touchpad through an input terminal of the oscillator, the input to the first terminal of the oscillator core may be dependent on whether a body is touching the touchpad, and the total capacitance of the first capacitor may be lower than the total capacitance of the second capacitor.

The oscillator core may include an LC circuit configured to variably generate the oscillation signal dependent on changes in capacitance at the touchpad.

The total capacitance of the first capacitor may satisfy C1=m×C2, where C1 denotes the total capacitance of the first capacitor, C2 denotes the total capacitance of the second capacitor, and m denotes a ratio variable between the total capacitance value of the first capacitor and the total capacitance of the second capacitor, where the ratio variable may be a real number of 3 or more.

The device may further include an output circuit connected between the second terminal and an output terminal of the oscillator, where the output circuit may be configured to control a selective output of the oscillation signal at the output terminal.

The device may further include an output circuit connected between the second terminal and an output terminal of the oscillator, where the output circuit may be configured to enable or disable an output of the oscillation signal at the output terminal based on an enable signal.

The device may further include an output circuit may include a logic circuit configured to control the output of the oscillation signal at the output terminal based on the enable signal.

The oscillation core may include an inductor and a gain adjuster connected in parallel in a differential oscillating structure.

The oscillation core may include, in a differential oscillating structure, an inductor, a pair of cross-coupled transistors, and a gain adjuster.

In one general aspect, an oscillator system includes an oscillator configured to variably generate an oscillation signal dependent on a first capacitor, a second capacitor, and respective changes in capacitance at a touchpad, wherein the first capacitor is connected between an input of the oscillator and a ground, the second capacitor is connected between an output of the oscillator and the ground, and a total capacitance of the first capacitor is lower than a total capacitance of the second capacitor.

The system may further include the touchpad, an input terminal connecting the touchpad to the input of the oscillator, and an output terminal for outputting the oscillation signal generated by the oscillator.

The system may further include an output circuit, connected to the output of the oscillator and connected to the output terminal, configured to control a selective output of the oscillation signal at the output terminal.

Other features and aspects will be apparent from the following detailed description, the drawings, and the claims.

BRIEF DESCRIPTION OF DRAWINGS

Throughout the drawings and the detailed description, the same reference numerals refer to the same or like elements. The drawings may not be to scale, and the relative sizes, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known or understood after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while various embodiments of the disclosure of this application will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures, for example. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure of this application. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include various changes in shape, such as those that occur during manufacturing. In addition, the structures, shapes, and numerical values described as one example of one or more embodiments may be non-limiting examples to help the reader understand example technical matters of the disclosure of this application, and such examples are not limited thereto, and the spirit and scope of the present disclosure are also not limited thereto. Examples herein may include various components, features, and embodiments of the disclosure of this application being variously combined as one or more example components, features, or embodiments, as non-limiting examples.

Figure 1:
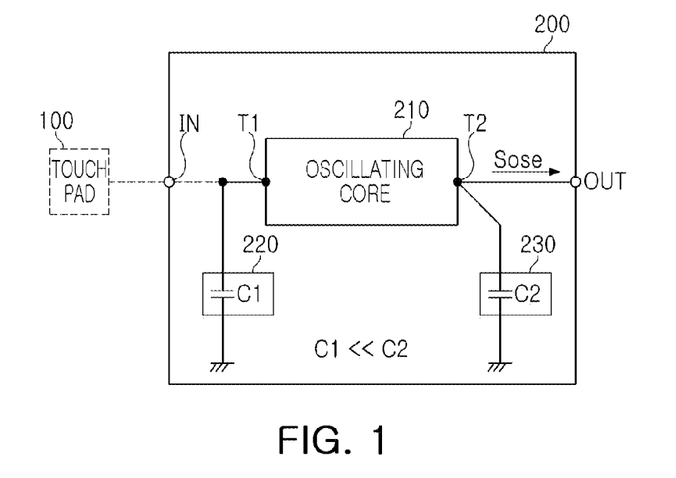
FIG. 1 is an example diagram of an oscillator according to one or more embodiments.
Figure 2:
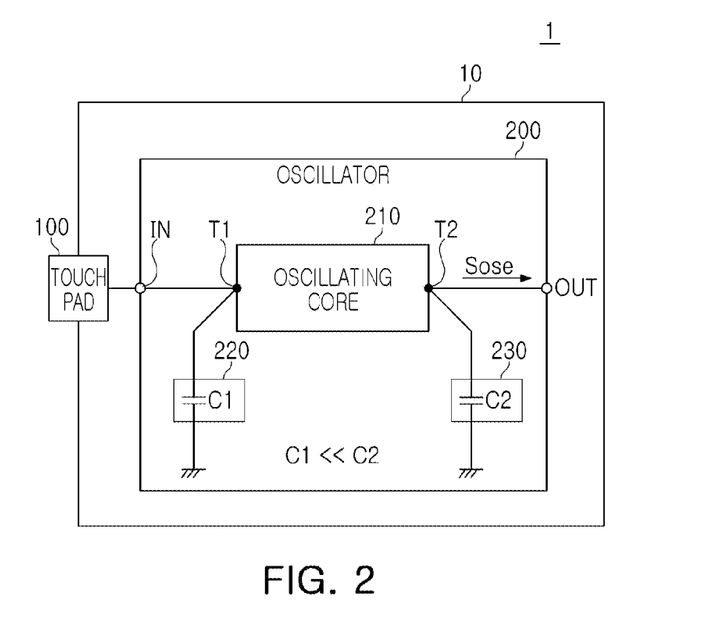
FIG. 2 is an example diagram of an electronic device with a touch sensing device according to one or more embodiments.

FIG. 1 is an example diagram of an oscillator according to one or more embodiments, and FIG. 2 is an example diagram of an electronic device with a touch sensing device according to one or more embodiments.

Referring to FIG. 2, an example oscillator device may be an oscillator 200, an example touch sensing device 10 that has a touchpad 100 and the oscillator 200, an example electronic device 1 having the example oscillator 200 configured for input from the touchpad 100, or an example electronic device 1 having the example touch sensing device 10 that has the touchpad 100 and the oscillator 200. For example, the touch sensing device 10 of such an electronic device 1 may be used as or part of a user interface of the electronic device. Further examples include the oscillator devices herein being configured as corresponding oscillator systems.

Referring to FIGS. 1 and 2, the oscillator 200 may include an input terminal IN and an output terminal OUT, may be connected to the touchpad 100, and may include an oscillating core 210, a first capacitor 220, and a second capacitor 230, connected between the input terminal IN and the output terminal OUT.

The touchpad 100 may be disposed, for example, in a case of the electronic device 1, may be a portion of the case, or may be connected to the electronic device 1, but examples are not limited thereto. As an example, the touchpad 100 may be a sensing pad for sensing a human hand touch.

The oscillating core 210 may be connected between a first terminal T1 connected to the input terminal IN and a second terminal T2 connected to the output terminal OUT.

For example, the oscillating core 210 may be connected to the touchpad 100 through the input terminal IN, may generate an oscillation signal Sosc having a resonance frequency determined by capacitance and internal inductance of the first capacitor 220 and the second capacitor 230, and may output the oscillation signal Sosc through the output terminal OUT.

In addition, the first capacitor 220 may be connected to the input terminal IN, the second capacitor 230 may be connected to the output terminal OUT outputting the oscillation signal, and the first capacitor 220 may include a first capacitance value that is different from a second capacitance value of the second capacitor 230.

The first capacitor 220 may be connected to the touchpad 100 through the input terminal IN physically separated from the output terminal OUT, may be connected between the first terminal T1 and a ground, and may include a first capacitance value C1. For example, herein, the first capacitor 220 may represent one or more capacitors.

The second capacitor 230 may be connected between the second terminal T2 and the ground, and may include a second capacitance value C2. For example, herein, the second capacitor 230 may represent one or more capacitors.

In the oscillator 200, according to one or more embodiments, in order to improve sensitivity and reduce current consumption compared to typical touch sending devices, the first capacitor 220 may have a first capacitance value lower than a second capacitance value of the second capacitor 230 (e.g., $C1 \ll C2$).

Figure 3:
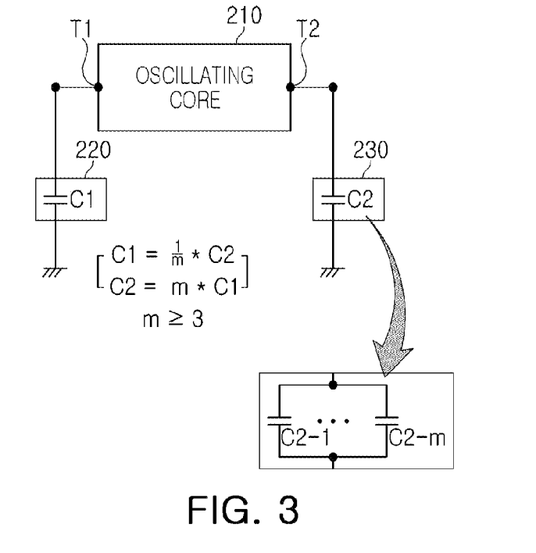
FIG. 3 is an example diagram of an oscillator according to one or more embodiments.

FIG. 3 is an example diagram of an oscillator according to one or more embodiments.

Referring to FIG. 3, a first capacitor 220 may have a first capacitance value C1 satisfying Equation 1 below, for example.

$$C1 = m \times C2 \qquad \text{Equation 1:}$$

In Equation 1, C1 is a first capacitance value of the first capacitor 220, C2 is a second capacitance value of a second capacitor 230, and m is a ratio variable between the first capacitance value and the second capacitance value, which is a real number of 3 or more.

For example, the second capacitor 230 may include a plurality of capacitors, e.g., a first capacitor C2-1 to an $m^{th}$ capacitor C2-m, e.g., connected to each other in parallel.

In an example, a capacitor of the first capacitor 220 and the plurality of capacitors, e.g., the first capacitor C2-1 to the $m^{th}$ capacitor C2-m, may have the same capacitance, and in this case, m may be a natural number equal to or greater than 3.

Figure 4:
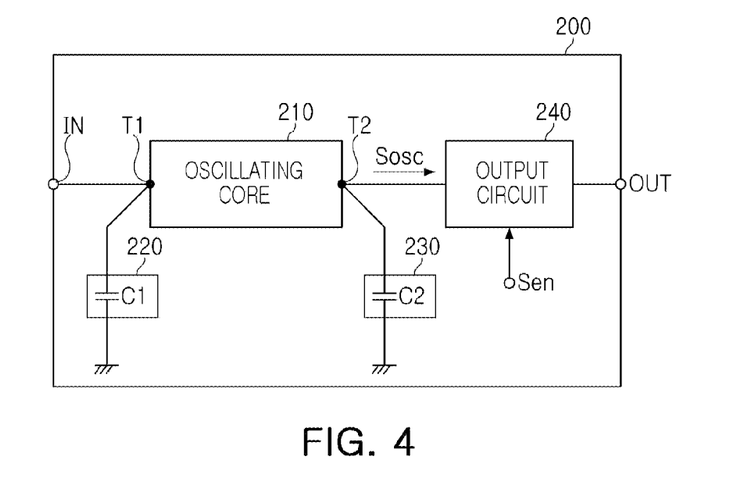
FIG. 4 is an example diagram of an oscillator according to one or more embodiments.

FIG. 4 is an example diagram of an oscillator according to one or more embodiments.

Referring to FIG. 4, an oscillator 200 may include an output circuit 240.

The output circuit 240 may be connected between a second terminal T2 and an output terminal OUT to control output of an oscillation signal Sosc.

For example, the output circuit 240 may enable or disable the output of the oscillation signal Sosc, based on an enable signal Sen, to selectively output the oscillation signal Sosc based on the enable signal Sen (and/or a disable signal), as a non-limiting example.

Figure 5:
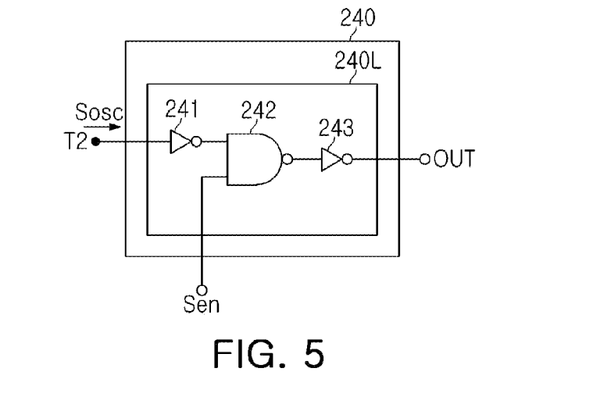
FIG. 5 is an example diagram of an output circuit according to one or more embodiments.

FIG. 5 is an example diagram of an output circuit, such as the output circuit of FIG. 4, according to one or more embodiments.

Referring to FIGS. 4 and 5, the output circuit 240 may include a logic circuit 240L.

The logic circuit 240L may control the selective output of the oscillation signal Sosc based on the enable signal Sen.

For example, the logic circuit 240L may include a first inverter 241, a NAND gate 242, and a second inverter 243.

Since the logic circuit 240L illustrated in FIG. 5 is only illustrative of one example, embodiments are not limited thereto, and examples include various structures capable of controlling the output of the oscillation signal Sosc dependent on application or non-application of the enable signal Sen (and/or a disable signal).

The first inverter 241 may invert the oscillation signal, input through the example second terminal T2 of an oscillating core 210, to generate and output an inverted first oscillation signal.

The NAND gate 242 may perform an AND and inversion operations between the inverted first oscillation signal from the first inverter 241 and the enable signal Sen, and may output a result therefrom. For example, the NAND gate 242 may output the inverted first oscillation signal only when the enable signal Sen is a predetermined low level (or lower than a predetermined high level), and may block the output of the inverted first oscillation signal when the enable signal Sen is the predetermined high level (or higher than the predetermined low level), noting that alternate circuits to selectively output the oscillation signal are also available.

The oscillator 200 according to one or more embodiments may be an LC oscillator, and the oscillating core 210 of according to one or more embodiments may be formed of a differential oscillating structure, e.g., having excellent noise characteristics, with a non-limiting example being further described below with reference to FIGS. 6 and 7.

Figure 6:
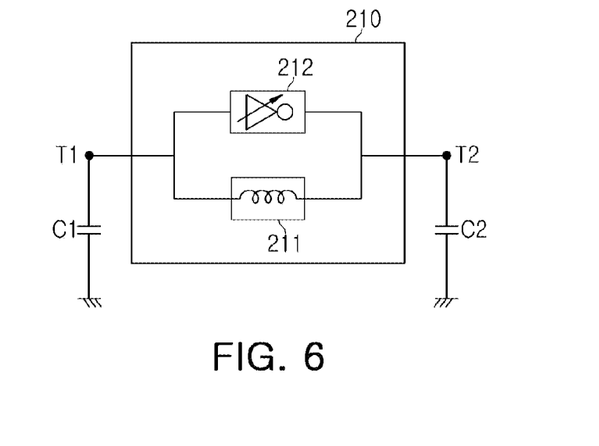
FIG. 6 is an example diagram of an oscillating core according to one or more embodiments.

FIG. 6 is an example diagram of an oscillating core according to one or more embodiments.

Referring to FIG. 6, an oscillating core 210 may include an inductor 211 and a gain adjuster 212, e.g., connected to each other in parallel, and may have a differential oscillating structure, for example.

The inductor 211 may provide a preset inductance that forms a resonance circuit together with the capacitance of a first capacitor 220 and the capacitance of a second capacitor 230, and may generate a signal having resonance frequency by the resonance circuit.

The gain adjuster 212 may be connected in parallel to the inductor 211, for example, to provide a gain for oscillation, and may generate an oscillation signal having resonance frequency by the resonance circuit.

Figure 7:
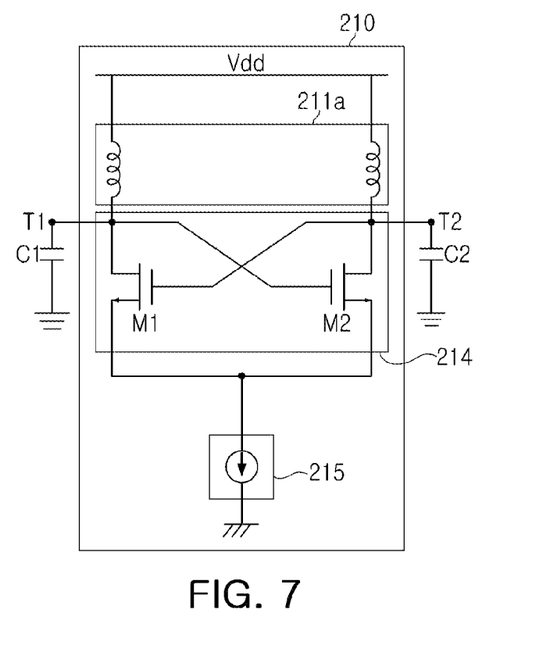
FIG. 7 is an example diagram of an oscillating core according to one or more embodiments.

FIG. 7 is an example diagram of an oscillating core according to one or more embodiments.

Referring to FIG. 7, an oscillating core 210 may include an inductor 211a, a pair of cross-coupled transistors 214, and a gain adjuster 215, and may be a differential oscillating structure, for example.

The inductor 211a may be connected to an operating voltage unit Vdd, may include a preset inductance, and may form a resonance circuit together with the capacitance of a first capacitor 220 and the capacitance of a second capacitor 230.

The pair of cross-coupled transistors 214 may be disposed between the inductor 211a and the gain adjuster 215, and may include transistors M1 and M2, as a non-limiting example, having a gate-drain cross-coupled structure for oscillation using 180 degree phase coupling, for example.

The gain adjuster 215 may be connected between the pair of cross-coupled transistors 214 and a ground to adjust a gain for oscillation in the pair of cross-coupled transistors 214.

Therefore, the example pair of cross-coupled transistors 214 may generate an oscillation signal having resonance frequency by a resonance circuit.

In various examples, an oscillator 200 according to one or more embodiments may include an oscillating structure that does not decrease sensitivity and may even improve the sensitivity compared to a typical touch sensing device, even when frequency is lowered, with a non-limiting example being described below with reference to FIG. 8.

Figure 8:
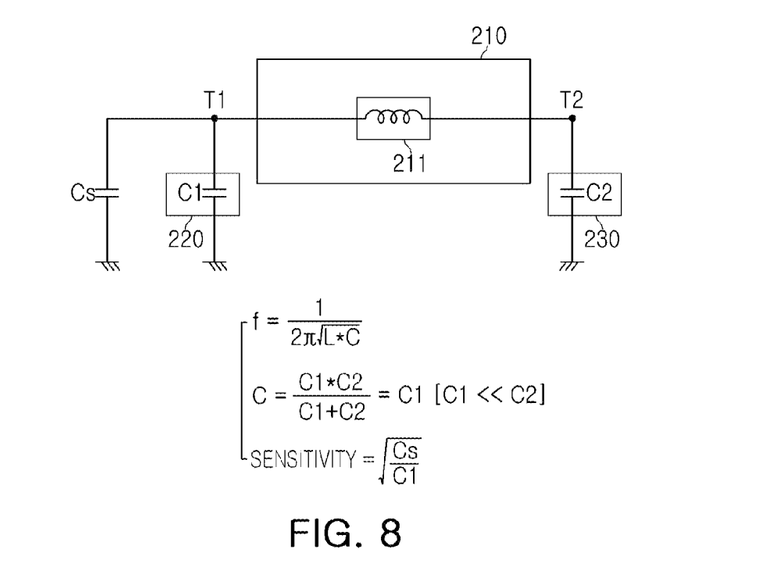
FIG. 8 is an example diagram of sensitivities and resonance frequencies of a touch sensing device according to one or more embodiments.

FIG. 8 is an example diagram of sensitivities and resonance frequencies of a touch sensing device according to one or more embodiments.

Referring to FIG. 8, in a touch sensing device 10 (e.g., touch housing device 10 of FIG. 2) according to one or more embodiments, when a human finger touches a touchpad 100, sensing capacitance Cs provided by the touch may be added in parallel to first capacitance C1 of a first capacitor 220, to change a frequency of an oscillation signal (e.g., with the changed frequency representing a touch sensing signal) of an oscillator 200 of the touch sensing device 10.

Therefore, when the human finger touches the touchpad 100, the touchpad 100 may be applied to the first capacitor 220 having first capacitance C1 lower, e.g., much lower, than second capacitance C2 of a second capacitor 230 (e.g., C1<<C2).

Resonance frequency f of the oscillator 200 according to one or more embodiments may be expressed as Equation 2 below, for example, and sensitivity may be expressed as Equation 3 below, for example.

$$f=1/\{2\pi\times\sqrt{\{(L\times C)\}}\}$$

$$C=(\{C1\times C2\}/\{C1+C2\})\approx C1(\text{if } C1<<C2) \quad \text{Equation 2:}$$

$$\text{Sensitivity}=\sqrt{\{(Cs/C1)\}} \quad \text{Equation 3:}$$

Referring to Equation 3 above, as a value of the first capacitance C1 decreases, a value of the sensing capacitance Cs may become dominant, and an output frequency may be greatly or substantially changed when there is a touch response, e.g., when example finger(s) or other body parts touch the touchpad. Therefore, sensitivity may be improved compared to typical touchpad approaches.

In addition, an output terminal OUT of the oscillator 200 may be connected to a second terminal T2 connected to the second capacitor 230, not the first capacitance C1 of the first capacitor 220, e.g., not a first terminal T1 to which the touchpad 100 is connected. Therefore, a more stable operation may be achieved.

In order to use a low value of the first capacitance C1 while generating the same frequency of the oscillation signal Sosc, as in Equation 2 above, when the first capacitance C1 is much lower than the second capacitance C2, the output frequency of the oscillation signal Sosc may be a function of the first capacitance C1. In this case, a lower value of the first capacitance C1 may be used to generate an output frequency, compared to a typical structure configured to generate the same frequency, and thus one or more embodiments may provide improved sensitivity compared to such typical structures, as illustrated in Equation 3 above.

Figure 9:
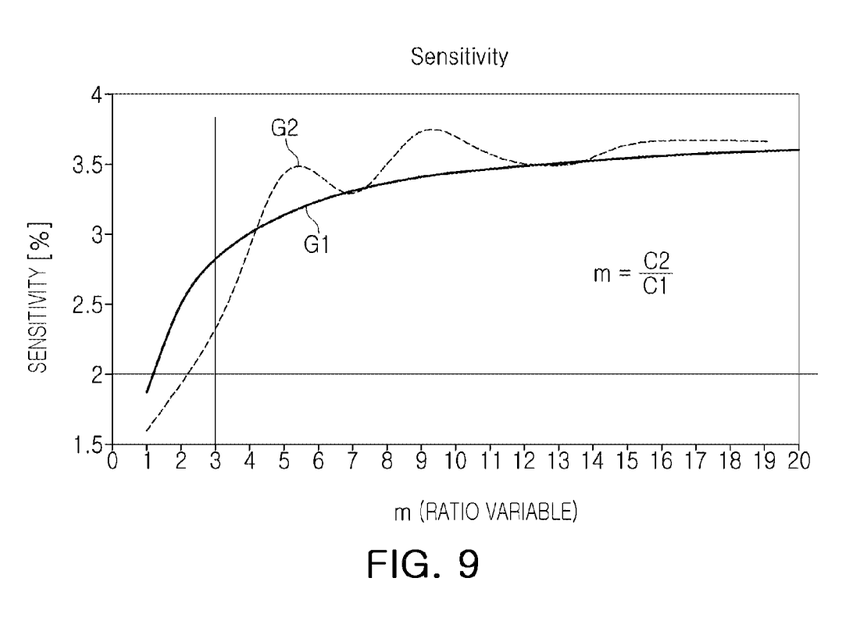
FIG. 9 is an example diagram for a ratio variable (m)-sensitivity between a first capacitance and a second capacitance according to one or more embodiments.

FIG. 9 is an example diagram for a ratio variable (m)-sensitivity between a first capacitance and a second capacitance according to one or more embodiments.

Referring to FIG. 9, an example ratio variable of first capacitance C1 to second capacitance C2 is defined as "m", and a range of m was tested and results of this testing is illustrated in FIG. 9.

In FIG. 9, an example ideal sensitivity with respect to the ratio variable m was equal to G1, and sensitivity according to this tested example, i.e., according to one or more embodiments, with respect to the ratio variable m was equal to G2.

In FIG. 9, when sensitivity is defined as "(a change in oscillation frequency upon touch)/(oscillation frequency before touch)×100 [%]," for example, and the oscillation frequency before a touch being applied to the touchpad was 50 MHz, the resultant change in oscillation frequency upon the touch was 0.5 MHz, demonstrating that the corresponding sensitivity may be '(0.5 MHz)/(50 MHz)×100 [%]=1%.'

Referring to G1 and G2 illustrated in FIG. 9, and the sensitivity is 2% or more, it can be seen that the resultant sensitivity was demonstrated as being excellent as 2% or more, when a lower limit of the ratio variable m was set to 3.

Generally, for example, sensitivity may be set to 1% as a threshold value, and a system may determine on/off switching thereof, based on the threshold value. Accordingly, in one or more embodiments, a stable touch sensor may be achieved by examples variously having their sensitivities be at least 2%, such as in consideration of noise or margin.

For example, as illustrated in Equation 2 above, when a range of the ratio variable m is 3 or more, the capacitance C determining resonance frequency may be roughly simplified as C1.

Therefore, in an oscillator according to one or more embodiments, since a same sensitivity may be obtained with a lowered output frequency compared to a typical configuration, current consumption may be reduced. Likewise, a higher sensitivity may also be obtained according to one or more embodiments at a same output frequency compared to such a typical configuration.

Figure 10:
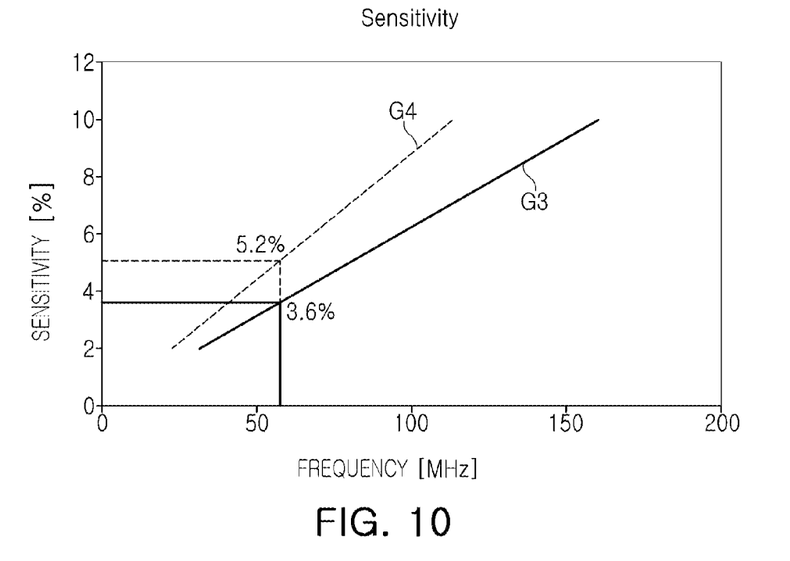
FIG. 10 is an example diagram of a relationship with respect to frequency-sensitivity according to one or more embodiments.

FIG. 10 is an example diagram of a relationship with respect to frequency-sensitivity according to one or more embodiments.

Referring to FIG. 10, G3 represents the sensitivity with respect to frequency response of a tested typical touch sensing device, compared to G4 which represents a sensitivity with respect to a frequency response of a tested example touch sensing device according to one or more embodiments.

Referring to G3 and G4 illustrated in FIG. 10, the sensitivity of the typical touch sensing device at an output frequency of 58 MHz was 3.6%. Rather, the sensitivity of the example touch sensing device increased to 5.2% at a same output frequency as the frequency output of the typical touch sensing device. Therefore, such tested comparisons demonstrate that a touch sensing device according to one or more embodiments may provide an improvement over the typical touch sensing devices by approximately 44%, as a non-limiting example.

One or more or all embodiments may be applied to or include one or more keyless systems, user interfaces, and electronic devices, may provide one or more oscillators with lower frequencies and with reduced current consumption compared to typical oscillator implementations in typical keyless systems, and may provide increased stabilities of oscillating operations to improve sensitivity of one or more example touch sensors, for example, compared to typical oscillator implementations in a typical touch sensor with a typical oscillator implementation.

While specific examples have been illustrated and described above, it will be apparent after gaining an understanding of this disclosure that various changes in form and details may be made in these examples without departing from the spirit and scope of the claims and their equivalents. The examples described herein are to be considered in a descriptive sense only, and are not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An oscillator device comprising:
    an oscillation core having a second terminal configured to output an oscillation signal generated by the oscillation core based on an input to a first terminal of the oscillation core;
    a first capacitor connected between the first terminal and a ground; and
    a second capacitor connected between the second terminal and the ground,
    wherein a total capacitance of the first capacitor is different from a total capacitance of the second capacitor, and
    wherein the first capacitor is connected to a capacitive touchpad through an input terminal of the oscillator device connected to the first terminal of the oscillator core.

2. The device of claim 1, wherein the input to the first terminal of the oscillation core is dependent on whether a body having a capacitance is touching the touchpad, and the total capacitance of the first capacitor is lower than the total capacitance of the second capacitor.

3. The device of claim 1, wherein the total capacitance of the first capacitor satisfies:

$$C1 = m \times C2,$$

where C1 denotes the total capacitance of the first capacitor, C2 denotes the total capacitance of the second capacitor, and m denotes a ratio variable between the total capacitance of the first capacitor and the total capacitance of the second capacitor, with the ratio variable being a real number of 3 or more.

4. The device of claim 1, further comprising an output circuit connected between the second terminal and an output terminal of the oscillator device, where the output circuit is configured to control a selective output of the oscillation signal at the output terminal.

5. The device of claim 1, further comprising an output circuit connected between the second terminal and an output terminal of the oscillator device, where the output circuit is configured to enable or disable an output of the oscillation signal at the output terminal based on an enable signal.

6. The device of claim 5, wherein the output circuit comprises a logic circuit configured to control the output of the oscillation signal at the output terminal based on the enable signal.

7. The device of claim 1, wherein the oscillation core comprises an inductor and a gain adjuster connected in parallel in a differential oscillating structure.

8. The device of claim 1, wherein the oscillation core comprises, in a differential oscillating structure, an inductor, a pair of cross-coupled transistors, and a gain adjuster.

9. An oscillator device comprising:
    a touchpad; and
    an oscillator comprising:
        an oscillation core having a second terminal configured to output an oscillation signal generated by the oscillation core based on an input to a first terminal of the oscillation core;
        a first capacitor connected between the first terminal and a ground; and
        a second capacitor connected between the second terminal and the ground,
    wherein the first capacitor is connected to the touchpad,
    wherein a total capacitance of the first capacitor is different from a total capacitance of the second capacitor, and
    wherein the first capacitor is connected to the touchpad through an input terminal of the oscillator connected to the first terminal of the oscillator core.

10. The device of claim 9, wherein the input to the first terminal of the oscillator core is dependent on whether a body is touching the touchpad, and the total capacitance of the first capacitor is lower than the total capacitance of the second capacitor.

11. The device of claim 9, wherein the oscillator core comprises an LC circuit configured to variably generate the oscillation signal dependent on changes in capacitance at the touchpad.

12. The device of claim 9, wherein the total capacitance of the first capacitor satisfies:

$$C1 = m \times C2,$$

where C1 denotes the total capacitance of the first capacitor, C2 denotes the total capacitance of the second capacitor, and m denotes a ratio variable between the total capacitance value of the first capacitor and the total capacitance of the second capacitor, with the ratio variable being a real number of 3 or more.

13. The device of claim 9, further comprising an output circuit connected between the second terminal and an output terminal of the oscillator, where the output circuit is configured to control a selective output of the oscillation signal at the output terminal.

14. The device of claim 9, further comprising an output circuit connected between the second terminal and an output terminal of the oscillator, where the output circuit is configured to enable or disable an output of the oscillation signal at the output terminal based on an enable signal.

15. The device of claim 14, wherein the output circuit comprises a logic circuit configured to control the output of the oscillation signal at the output terminal based on the enable signal.

16. The device of claim 9, wherein the oscillation core comprises an inductor and a gain adjuster connected in parallel in a differential oscillating structure.

17. The device of claim 9, wherein the oscillation core comprises, in a differential oscillating structure, an inductor, a pair of cross-coupled transistors, and a gain adjuster.

18. An oscillator system comprising:
an oscillator configured to variably generate an oscillation signal dependent on a first capacitor, a second capacitor, and respective changes in capacitance at a touchpad,
wherein the first capacitor is connected between an input of the oscillator and a ground, the second capacitor is connected between an output of the oscillator and the ground, and a total capacitance of the first capacitor is lower than a total capacitance of the second capacitor, and
wherein the first capacitor is connected to the touchpad through an input of the oscillator and the input of the oscillator is connected to a terminal of an oscillation core of the oscillator.

19. The system of claim 18, comprising:
the touchpad;
an input terminal connecting the touchpad to the input of the oscillator; and
an output terminal for outputting the oscillation signal generated by the oscillator.

20. The system of claim 19, further comprising an output circuit, connected to the output of the oscillator and connected to the output terminal, configured to control a selective output of the oscillation signal at the output terminal.

* * * * *